(12) United States Patent
Komatsu et al.

(10) Patent No.: US 7,796,672 B2
(45) Date of Patent: Sep. 14, 2010

(54) LIGHT SOURCE DEVICE AND PROJECTOR INCLUDING LIGHT SOURCE DEVICE

(75) Inventors: Akira Komatsu, Kamiina-gun (JP); Masatoshi Yonekubo, Hara-mura (JP); Mitsuo Nagata, Suwa (JP); Takashi Takeda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/609,733

(22) Filed: Dec. 12, 2006

(65) Prior Publication Data

US 2007/0133628 A1 Jun. 14, 2007

(30) Foreign Application Priority Data

Dec. 13, 2005 (JP) .............................. 2005-359495

(51) Int. Cl.
*H01S 3/08* (2006.01)
*H01S 3/098* (2006.01)
*H01S 3/10* (2006.01)

(52) U.S. Cl. .............................. 372/99; 372/19; 372/21; 372/22; 372/102; 372/108

(58) Field of Classification Search .................. None
See application file for complete search history.

(56) References Cited

U.S. PATENT DOCUMENTS

| 5,185,752 | A | * | 2/1993 | Welch et al. ................... 372/22 |
| 5,390,210 | A | | 2/1995 | Fouquet et al. |
| 5,436,920 | A | | 7/1995 | Minemoto et al. |
| 5,918,108 | A | | 6/1999 | Peters |
| 6,212,213 | B1 | * | 4/2001 | Weber et al. ................ 372/50.1 |
| 6,570,893 | B1 | * | 5/2003 | Libatique et al. ............... 372/20 |
| 7,463,664 | B2 | | 12/2008 | Mizuuchi et al. |

(Continued)

FOREIGN PATENT DOCUMENTS

EP 0 632 553 A2 1/1995

(Continued)

OTHER PUBLICATIONS

Yamada, N. et al., "Second-Harmonic Generation in Vertical-Cavity Surface-Emitting Laser", Japanese Society of Applied Physics, vol. 35 (1996), pp. 2659-2664.

(Continued)

*Primary Examiner*—Minsun Harvey
*Assistant Examiner*—Sean Hagan
(74) *Attorney, Agent, or Firm*—Oliff & Berridge, PLC

(57) ABSTRACT

A light source device includes: a laser light source emitting a laser beam of a prescribed wavelength; a nonlinear optical element, disposed facing a light emergence surface of the laser light sources which converts an emission wavelength of the laser beam emitted from the laser light source and causes the laser beam to emerge; a volume phase grating, disposed facing an emergence surface of the laser beam of the converted wavelength converted by the nonlinear optical element, which has formed in an interior thereof a Bragg grating structure which selectively reflects a laser beam of an emission wavelength; and a first dielectric multilayer, provided on a light emergence surface of the volume phase gratings which transmits the laser beam of the converted wavelength and reflects the laser beam of the emission wavelength.

11 Claims, 4 Drawing Sheets

U.S. PATENT DOCUMENTS

| | | |
|---|---|---|
| 2006/0023173 A1 | 2/2006 | Mooradian et al. |
| 2006/0023757 A1 | 2/2006 | Mooradian et al. |
| 2006/0268241 A1 | 11/2006 | Watson et al. |
| 2006/0280219 A1 | 12/2006 | Shchegrov |
| 2007/0153862 A1 | 7/2007 | Shchegrov et al. |
| 2007/0153866 A1 | 7/2007 | Shchegrov et al. |

FOREIGN PATENT DOCUMENTS

| | | |
|---|---|---|
| EP | 0 898 344 A2 | 2/1999 |
| JP | A-6-132595 | 5/1994 |
| JP | A 6-132595 | 5/1994 |
| JP | A-8-51248 | 2/1996 |
| WO | WO 2004/075362 A2 | 9/2004 |
| WO | WO 2005/009054 A1 | 10/2005 |

OTHER PUBLICATIONS

Mooradian et al., "High Power Extended Vertical Cavity Surface Emitting Diode Lasers and Arrays and Their Applications." Micro-Optics Conference, Nov. 2, 2005. pp. 1-4.

* cited by examiner

LIGHT SOURCE DEVICE AND PROJECTOR INCLUDING LIGHT SOURCE DEVICE

This application claims priority from Japanese Patent Application No. 2005-359495, filed in the Japanese Patent, Office on Dec. 13, 2005, the entire disclosure of which is hereby incorporated by reference in its entirety.

BACKGROUND

1. Technical Field

The present invention relates to a light source device which emits a laser beam, and a projector including the device 2. Related Art To date, a laser diode has been known which loads a prescribed amount of energy on a laser medium, reflects laser beams emerging from the laser medium with mirrors provided at both ends of the laser medium, and amplifies an output of the laser beams at the laser medium. (For example, refer to JP-A-6-132595 (refer to Pages 2 to 3 and FIGS. 1 and 2)).

A laser diode disclosed in JP-A-6-132595 is a second harmonic light generator with a mirror structure formed at one end of a light source, a non-reflecting structure formed at the other end, and a nonlinear optical unit provided facing the non-reflecting structure in the second harmonic light generator, a laser beam emitted from the non-reflecting structure by the nonlinear optical unit is wavelength converted, and a second harmonic light is generated. Also, a mirror structure being formed at each end of the nonlinear optical unit, a mirror structure, from among the mirror structures, on a side not facing a light source has a high reflectance with respect to a basic wavelength, and a low reflectance with respect to the wavelength converted second harmonic light, while a mirror structure on a side facing the light source is a non-reflecting structure. Then, while a laser beam emitted from the light source is reflected by the mirror structure on an end surface of the nonlinear optical unit on the side not facing the light source, and the mirror structure formed at one end surface of the light source, and energy of the laser beam amplified, the laser beam wavelength converted by the nonlinear optical unit emerges from the mirror structure of the nonlinear optical unit on the end surface on the side not facing the light source.

However, in a case of a heretofore known second harmonic light generator such as that disclosed in JP-A-6-132595, as a laser beam is not band narrowed, a problem has been raised as an example in that an emission wavelength of a laser diode fluctuates depending on temperature, an emission wavelength interval of a laser beam emitted from a light source is wider than an allowable interval of a converted wavelength of a nonlinear optical unit, light of a wavelength band not wavelength converted increases, and a conversion efficiency deteriorates.

SUMMARY

An advantage of some aspects of the invention is to provide a light source device which effectively emits a laser beam, and a projector including the light source device.

A light source device according to one aspect of the invention includes: a laser light source emitting a laser beam of a prescribed wavelength; a nonlinear optical element, disposed facing a light emergence surface of the laser light source, which converts an emission wavelength of the laser beam emitted from the laser light source and causes the laser beam to emerge; a volume phase gyrating, disposed facing an emergence surface of the laser beam of the converted wavelength converted by the nonlinear optical element, which has formed in an interior thereof a Bragg grating structure which selectively reflects a laser beam of an emission wavelength; and a first dielectric multilayer, provided on a light emergence surface of the volume phase grating, which transmits the laser beam of the converted wavelength and reflects the laser beam of the emission wavelength.

In this case, it is preferable that the Bragg grating of the volume phase grating reflects the laser beams at a reflectance of 95% or more with respect to the laser beams or the emission wavelength, while the first dielectric multilayer transmits the laser beams at a reflectance of 5% or less with respect to the wavelength converted laser beams.

In this kind of aspect of the invention, the nonlinear optical unit is disposed between the laser light source and the volume phase grating, and the laser beam emission wavelength is band narrowed by the Bragg grating of the volume phase grating. By this means, even in the event, for example, that a discrepancy occurs in the laser beam emission wavelength due to a fluctuation in temperature and the like, and a wavelength band of the emitted laser beams is widened, the laser beams of the emission wavelength are band narrowed by the Bragg grating of the volume phase grating. Consequently, even in the event of a discrepancy occurring in an emission wavelength of a laser diode due to a fluctuation in temperature and the like, and a wavelength band widening, it is possible to band narrow and standardize the laser beam emission wavelength by the volume phase grating. Therefore, a conversion efficiency of a wavelength conversion of the laser beams of the emission wavelength by the nonlinear optical element improves.

Also, as the nonlinear optical element is interposed between the laser light source and the volume phase grating, it is possible to effectively convert the wavelength of the laser beams of the emission wavelength coming and going between them, meaning that the wavelength conversion efficiency of the laser beams improves. Furthermore, by reflecting an increased number of the laser beams of the emission wavelength by the first dielectric muiltilayer of the volume phase grating, a resonance of the laser light source by the laser medium of the laser light source is promoted, and a laser beam output is amplified. Therefore, the laser beam emission efficiency and the wavelength conversion efficiency further improve, making it possible to project an effective laser beam from the light source device.

In one aspect of the invention, it is preferable to include a dielectric thin film, provided on a light incidence surface of the volume phase grating, which suppresses a reflection of the laser beam of the emission wavelength and the laser beam of the converted wavelength to the nonlinear optical element side.

According to this aspect of the invention, a dielectric thin film suppressing a reflection of both the laser beams of the emission wavelength and the laser beams of the converted wavelength is formed on the light incidence surface of the volume phase grating. By this means, it is possible to effectively cause the laser beams of the converted wavelength to fall on the volume phase grating, and it is possible to effectively cause the laser beams of the emission wavelength reflected by the volume phase grating to emerge to the nonlinear optical element, side.

In one aspect of the invention, it is preferable that the nonlinear optical element, being a bulk nonlinear optical element having a polarization reversal structure, includes: a second dielectric multilayer, provided on the light incidence surface of the nonlinear optical element, which reflects the laser beam of the converted wavelength and transmits the laser beam of the emission wavelength.

In this case, it is preferable that a second dielectric multiplayer reflectance with respect to the laser beams of the converted wavelength is 95% or more, while a reflectance with respect to the laser beams of the emission wavelength is 5% or less.

According to this aspect of the invention, the second dielectric multilayer which reflects the laser beams of the converted wavelength, and transmits the laser beams of the emission wavelength, is formed on the light incidence surface of the nonlinear optical element. By this means, the laser beams of the emission wavelength pass through the dielectric multilayer, whereon the laser beams of the emission wavelength transmitted and laser beams newly emitted by the laser light source resonate. Consequently, the output of the laser beams is amplified by the resonance of the laser beams, making it possible to improve the emission efficiency. Meanwhile, the laser beams of the converted wavelength are reflected by the second dielectric multiplayer, and emerge from the first dielectric multliplayer of the volume phase grating. Consequently, as the laser beams of the converted wavelength emerge from the first dielectric multiplayer without proceeding on a wasteful optical path, it is possible to suppress a laser beam energy loss, enabling an improvement in an emission output of the light source device.

In one aspect of the invention, it is preferable that the laser light source is a surface-emitting laser diode, including a reflecting mirror formed on a semiconductor wafer and a laser medium formed stacked on the reflecting mirror, which emits a laser beam and transmits it in a stacking direction of the reflecting mirror and the laser medium.

In the case of the surface-emitting laser diode, as it is possible to form a plurality of laser elements on the same semiconductor wafer, laser beams emitted from each of the laser elements emerge approximately vertically to a semiconductor wafer surface, in a mutually parallel direction. Consequently, it is possible to cause the emitted beams emerging from each of the laser elements to fall on the nonlinear optical element and the volume phase grating, and subject each of them to wavelength conversion and reflection of the emitted beams. By adopting this kind of configuration, it is possible for the laser elements of the plurality of surface-emitting laser diodes to share a use of the nonlinear optical element and the volume phase grating. By forming a plurality of laser elements in close proximity, even while increasing a power of the emergent laser beams by that number, it is possible and preferable to adopt an extremely compact configuration.

Meanwhile, it is also acceptable to have a configuration in which, the laser light source is a surface-emitting laser diode including a laser medium sandwiched between clad layers, and a pair of reflecting mirrors disposed facing both ends of the laser medium, wherein a beam parallelizer which parallelizes the laser beam emitted from the laser light source is provided between the light emergence surface of the laser light source and the nonlinear optical element.

According to this aspect of the invention, the laser light source being a so-called end surface-emitting laser diode which reflects the laser beams with an end surface of a laser medium sandwiched between clad layers, amplifies the output of the laser beams, and causes them to emerge, the nonlinear optical element and volume phase grating are disposed beyond the beam parallelizer which converts the laser beams into parallel beams. By this means, the laser beams which have not been wavelength converted by the nonlinear optical element are reflected by the volume phase grating, pass through the parallelizing lens, and emerge again from an emergence portion to the laser medium, enabling an amplification of the laser beam output.

It is preferable that a protector according to one aspect of the invention includes: a light source device emitting a laser beam; an optical modulator which modulates the laser beam emitted from the light source device in accordance with image information; and a projection optical system which projects the modulated laser beam, wherein the light source device is a light source device such as that described heretofore.

According to this aspect of the invention, in the projector, as the laser beams efficiently wavelength converted by the kind of light source device heretofore described are caused to emerge without causing any reduction in the emission output, it is possible to prevent any increase etc. in power consumed due to a energy loss. Also, it is possible to provide the laser light source with a projector of a simpler configuration, and which can be miniaturized.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
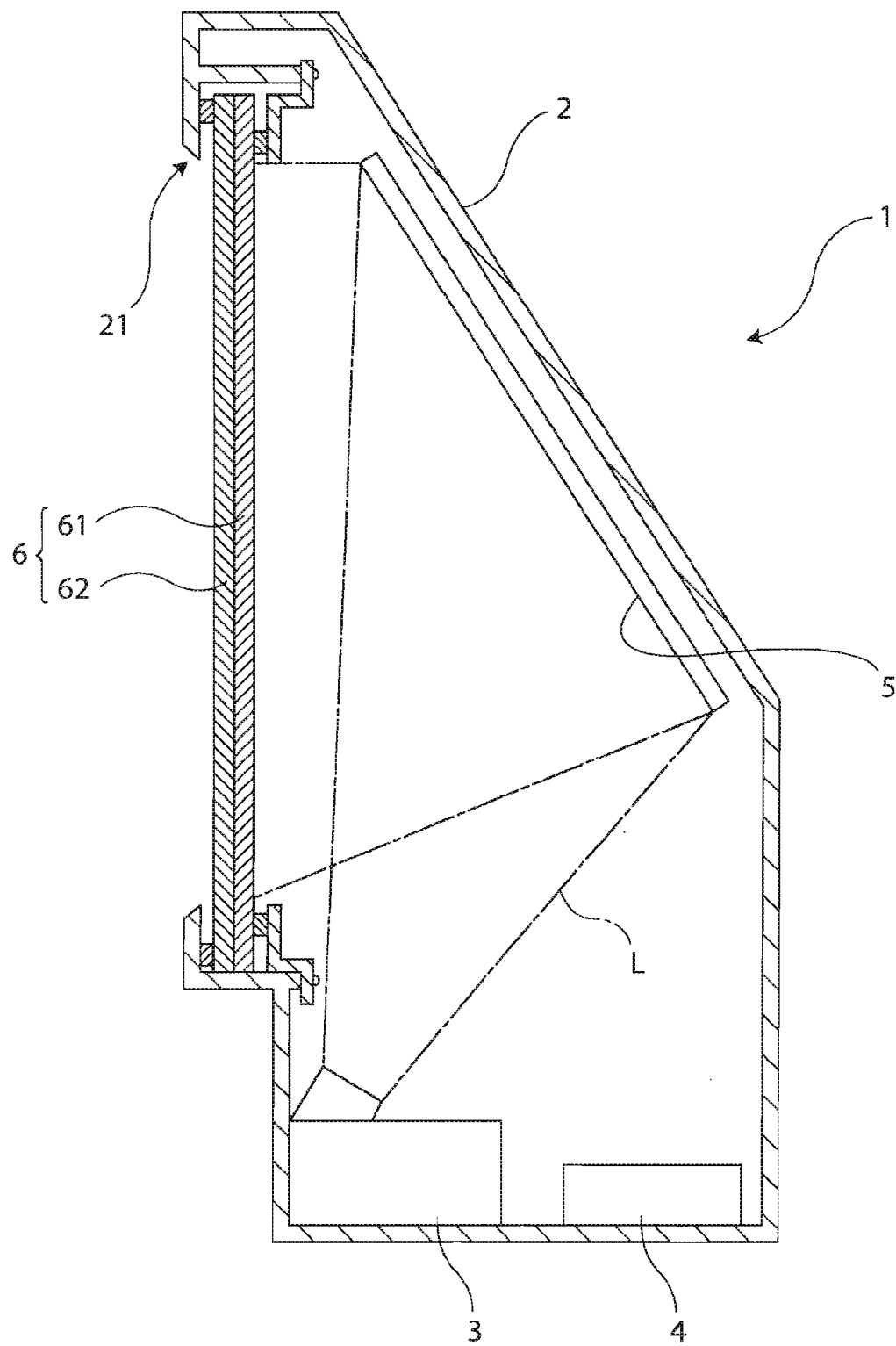
FIG. 1 is a sectional side view or a rear projector in a first embodiment according to the invention.

Hereafter, a description will be given of an embodiment of the invention, based on the drawings. Main configuration of a rear projector FIG. 1 is a sectional side view of a rear projector in a first embodiment according to the invention. In FIG. 1, 1 being a rear projector, the rear projector 1 is largely configured of a cabinet 2, a projector unit 3 as a projector, a control unit 4, a reflecting mirror 5 and a translucent screen 6.

As shown in FIG. 1, the cabinet 2 is configured as a box shape with a sloping back surface (a right side in FIG. 1), and contains the projector unit 3, the control unit 4 and the reflecting mirror 5 disposed in its interior. Although a specific depiction is omitted a power unit supplying power to each component member of the rear projector 1, and a cooling unit cooling the interior of the rear projector 1, a sound transmitter transmitting sound and the like are installed in the interior of the cabinet 2, as well as the projector unit 3, the control unit 4 and the reflecting mirror 5.

Also, a plan view rectangular aperture 21 is formed in a front surface of the cabinet 2 (a left side in FIG. 1), and the translucent screen 6 is secured to and supported by a surround of the aperture 21.

The projector unit 3, being installed on a bottom surface in the cabinet 2, forms an image light L based on an image signal transmitted from the control unit 4, and projects it, enlarged, toward the reflecting mirror 5. A specific configuration of the projector unit 3 will be described hereafter.

Although a specific depiction is omitted, the control unit 4 is configured to include, for example, a tuner, an interface circuit, a sound detecting circuit, an image detecting circuit, an amplifying circuit and a CPU etc., and carries out an overall control of the projector unit 3. Also, the control unit 4, for example, extracts a broadcast signal of a frequency corresponding to a channel selected in accordance with an operation of a remote controller (not shown) and, as well as transmitting an image signal to the projector unit 3, transmits a sound signal to the sound transmitter (not shown).

The reflecting mirror 5, being installed on an upper inner portion of the back surface of the cabinet 2, reflects the image light L projected by the projector unit 3 onto a back surface of the translucent screen 6.

The translucent screen 6, having a rectangular form, is secured to and supported by the surround of the aperture 21 of the cabinet 2. The translucent screen 6 is configured of a Fresnel lens sheet 61 installed on a back surface, and a lenticular lens sheet 62 installed on a front surface. Then, the translucent screen 6 converts the incident image light L via the reflecting mirror 5 into a parallel light with the Fresnel lens sheet 61, converts the parallel light into an enlarged (diffused) light with the lenticular lens sheet 62, projects the image light from the back surface to the front surface, and displays a projected image.

Configuration of the Projector Unit

Figure 2:
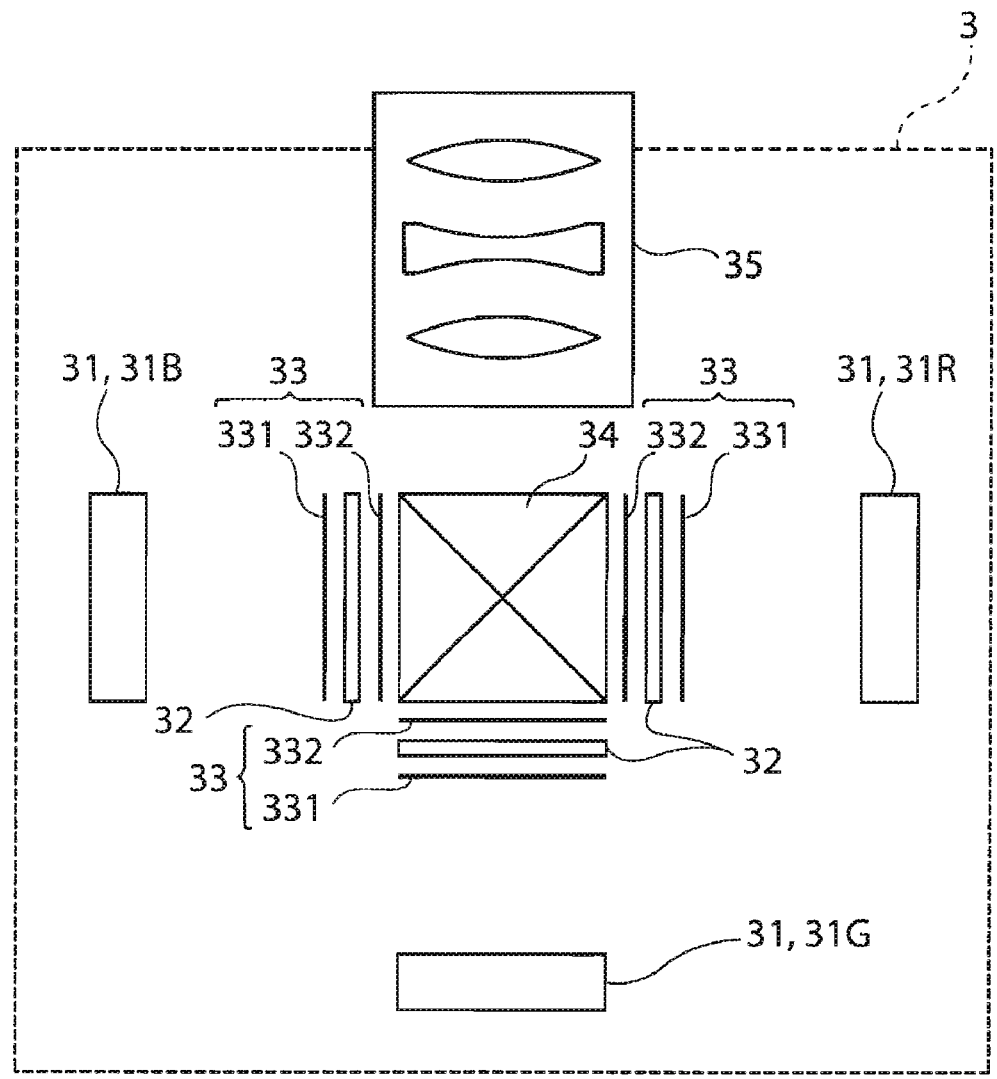
FIG. 2 is a schematic diagram showing an out line of an optical system configured inside a projector unit.

Next, a description will be given of a configuration of the projector unit 3, based on FIG. 2. FIG. 2 is a schematic diagram showing an outline of an optical system configured inside the projector unit.

The projector unit 3 is configured of light source devices 31, liquid crystal panels 32, polarizing plates 33, a cross diochroic prism 34, a projection lens 35 and the like. An optical element according to an aspect of the invention is configured of the liquid crystal panels 32, the polarizing plates 33 and the cross dichroic prism 34.

The light source devices 31 light up in accordance with a control signal received from the control unit, and emits laser beams toward the liquid crystal panels 32. The light source devices 31 include a red beam light source device 31R which emits a red laser beam, a blue beam light source device 31B which emits a blue laser beam, and a green beam light source device 31G which emits a green laser beam. As shown in FIG. 2, the light source devices 31 are installed in such a way as to each face one of three sides of the cross dichroic prism 34. Herein, the light source devices 31 are installed in such a way that the red beam light source device 31R and the blue beam light source device 31B face each other, and the protection lens 35 and the green beam light source device 31G face each other, across the cross dichroic prism 34. A detailed description of the light source devices 31 will be given hereafter.

The liquid crystal panels 32 using, or example, a polysilicon TFT (Thin Film Transistor) as a switching element, each colored light emerging from the light source device 31 is modulated, in accordance with the image information, by the three liquid crystal panels 32 and the polarizing plates 33 on their luminous flux incidence side and emergence side, forming an optical image.

The polarizing plates 33 each include incidence side polarizing plate 331 and emergence side polarizing plate 332 disposed on an optical path front line side and an optical path back line side of the liquid crystal panel 32. The incidence side polarizing plate 331, transmitting only polarized light of a certain direction from among the colored lights emerging from the light source device 31 and absorbing other luminous fluxes, has a polarizing film attached to a substrate of crystal, sapphire or the like. The emergence side polarizing plate 332 too, being configured in approximately the same way as the incidence side polarizing plate 331, transmits only polarized light of a prescribed direction from among the colored lights emerging from the liquid crystal panels 32 and absorbs other luminous fluxes. Also, it is acceptable to attach the polarizing film to the cross dichroic prism 34, without using the substrates or to attach the substrate to the cross dichroic prism 34. The incidence side polarizing plate 331 and the emergence side polarizing plate 332 are set in such a way that directions of their polarizing axis are mutually perpendicular.

The cross dichroic prism 34 is an optical element which synthesizes the optical images polarized into each colored light emerging from each liquid crystal panel 32, forming a color image. The cross dichroic prism 34 is formed of four right-angle prisms attached together in a plan view approximately square form with two dielectric multilayers formed on interfaces where the right-angle prisms adjoin. The dielectric multilayers reflect each colored light emerging from mutually opposing liquid crystal panels 32, and transmit colored light emerging from the liquid crystal panel 32 facing the projection lens 35. In this way, each colored light modulated by each liquid crystal pane 32 is synthesized, forming a color image.

The projection lens 35 is configured as a combination lens having a plurality of lenses combined. Then, the projection lens 35 forms an image light L based on the color image formed by the cross dichroic prism 34, and projects it, enlarged, toward the reflecting mirror 5.

Configuration of the Light Source Device

Figure 3:
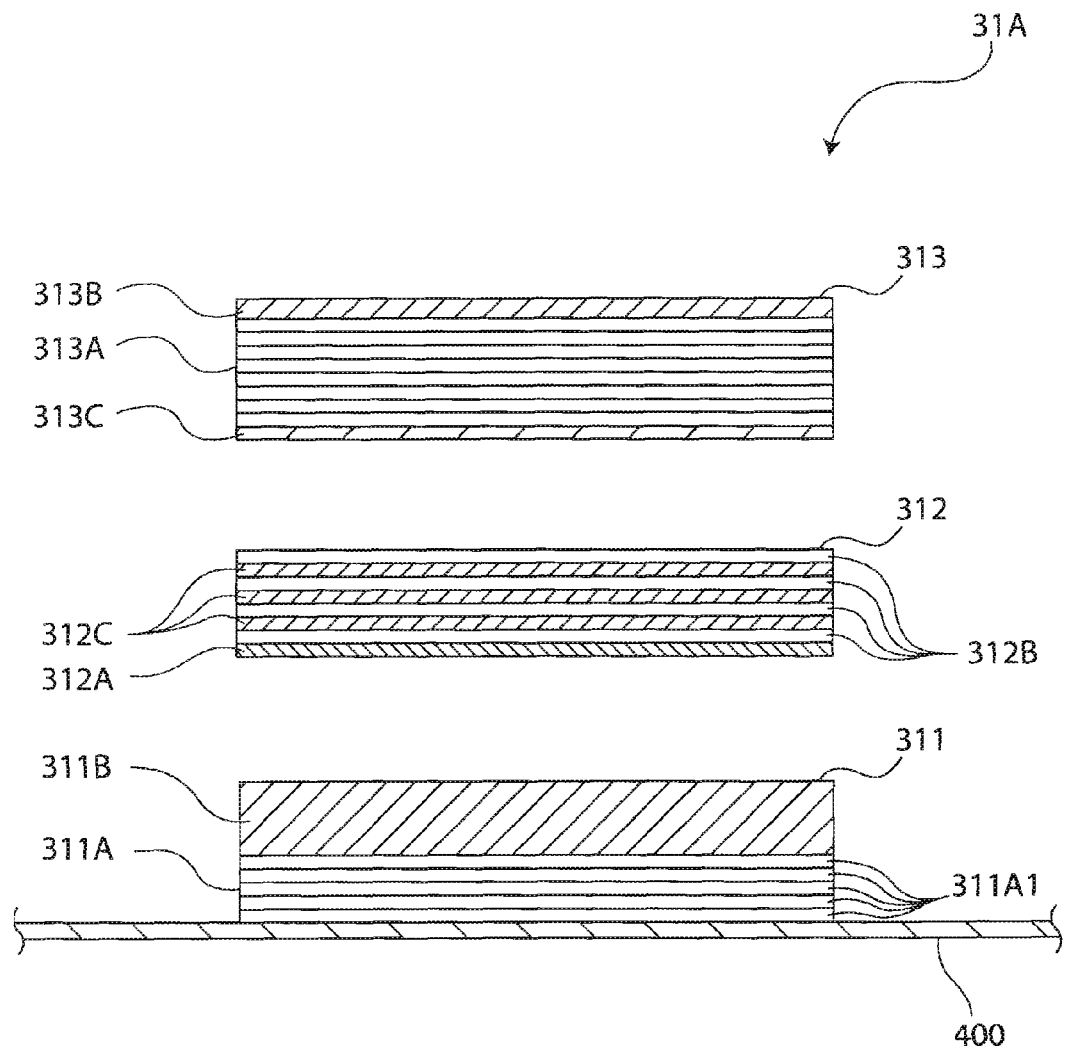
FIG. 3 is a sectional view schematically showing an outline of a laser light source unit which configures a light source device.

Next, a description will be given of a configuration of the light source device 31. FIG. 3 is a sectional view schematically showing an outline of a laser light source unit which configures the light source device.

Herein, the light source device 31 is configured by disposing a plurality of laser light source units 31A in, for example, a series. As shown in FIG. 3, the laser light source units 31A include a laser light source 311 which emits laser beams, a nonlinear optical element 312 which converts a wavelength of the laser beams emitted by the laser light source 311, and a VBG (Volume Bragg Grating) 313 as a volume phase grating which transmits laser beams of which the wavelength has been converted by the nonlinear optical element 312, and reflects laser beams of which the wavelength has not been converted.

As shown in FIG. 3, the laser light source 311 is formed on a substrate 400, which is a semiconductor wafer, and includes a mirror layer 311A as a reflecting mirror, and a laser medium 311B which is stacked on a surface of the mirror layer 311A.

The mirror layer 311A is formed directly on the substrate 400. That is, dielectric bodies are directly formed stacked in a layer form, by a method such as vapor deposition, at a wafer manufacturing stage of the substrate 400, and the mirror layer 311A is formed by the dielectric bodies. Also, the mirror layer 311A being formed of a high refractive index layer and a low refractive index layer stacked together, a thickness of each layer is set to a condition in which, from a wavelength of laser beams and a refractive index of each layer, reflected light interferes and mutually strengthens.

The laser medium 311B is formed on an upper surface of the mirror layer 311A. The laser medium 311B, being connected to a not-shown energizer, emits laser beams of a prescribed wavelength (hereafter, a wavelength of emitted laser beams will be referred to as an emission wavelength) on a prescribed volume of current flowing from the enegizer Also, the laser medium 311B amplifies laser beams of a transmitted emission wavelength. That is, laser beams reflected by the mirror layer 311A and the VBG, to be described hereafter, are amplified resonating with laser beams newly emitted by the laser medium, and emerge in a direction approximately perpendicular to the substrate 400.

The nonlinear optical element 312, facing the laser medium 311B of the laser light source 311, is disposed on an optical path of the laser beams emitted from the laser light source 311. The nonlinear optical element 312 is formed in a polarization reversal structure by alternately forming, at a prescribed interval, two areas 312B and 312C whose polarization directions are mutually reversed inside a crystalline substrate of an inorganic nonlinear optical material such as, for example, LN ($LiNbO_3$) or LT ($LiTaO_3$). Herein, the prescribed interval is determined as appropriate by the wavelength of the laser beams emitted from the laser light source 311 and a refractive index dispersion of the nonlinear optical element. The nonlinear optical element 312 generates a second harmonic from the wavelength of the laser beams emitted from the laser light source 311 (hereafter, a wavelength converted by the nonlinear optical element 312 will be referred to as a converted wavelength). For example, it generates a green laser beam of a wavelength of 532 nm from an infrared laser beam of an emission wavelength of 1064 nm emitted from laser light source 311.

Furthermore, in the nonlinear optical element 312, a luminosity of emergent laser beams of a converted wavelength is approximately proportional to the square of a luminosity of laser beams of an incident emission wavelength. For this reason, in order to improve a conversion efficiency, it is important to increase a luminosity of laser beams of an original emission wavelength.

Then, a second dielectric multilayer 312A is formed on a light incidence surface of the laser light source 311 side of the nonlinear optical element 312. The second dielectric multilayer 312A transmits laser beams of the emission wavelength at a transmittance of 95% or more, while reflecting laser beams of the converted wavelength at a reflectance of 95% or more.

The VBG 313 is an element which band narrows and reflects the laser beams of the emission wavelength. The VBG 313 includes a Bragg layer 313A stacked along a laser beam optical path, a first dielectric multilayer 313B formed on an exterior end surface of the Bragg layer 313A on an opposite side to the nonlinear optical element 312, and a dielectric thin film 313C formed on an end surface of the Bragg layer 313A on the nonlinear optical element 312 side.

The Bragg layer 313A projects an ultraviolet radiation of a prescribed wavelength onto a $SiO_2$ base glass layer of, for example, alkali boroaluminosilicate glass, forming interference patterns of differing refractive indexes in a layered formation inside the glass layer. In the Bragg layer 313A, laser beams of the emission wavelength only are selectively reflected, and an emission wavelength band of the laser beams is band narrowed. That is, in general, in a case of laser beams emitted from a laser diode, as a plurality of vertical modes is emitted in a gain band, their wavelengths change due to an effect of a fluctuation in temperature and the like. In this way, as the wavelength band of the laser beams, in general, is wider than an allowable wavelength band of a wavelength converted by the nonlinear optical element 312, a wavelength conversion efficiency in the nonlinear optical element 312 declines. In response to this, the Bragg layer 313A of the VBG 313 reflects only laser beams of a specified wavelength, from among the laser beams emerging from the laser diode, and band narrows the emission wavelength of the laser beams. Meanwhile, the laser beams of the converted wavelength converted by the nonlinear optical element 312 pass through the Bragg layer 313A, and fall on the first dielectric multilayer 313B.

The first dielectric multilayer 313B, being a so-called diochroic filter, transmits the laser beams of the converted wavelength, and reflects laser beams of any other wavelength. For example, in a case of the green beam light source device 31G, it reflects the red laser beam, which is the laser beam of the emission wavelength, and transmits the green laser beam, which is of the converted wavelength. At this time, the first dielectric multilayer 313B reflects the laser beams of the emission wavelength at a reflectance of 95% or more, while transmitting the laser beams of the converted wavelength at a transmittance of 95% or more, and causes them to emerge from the light source device 31.

The dielectric thin film 313C, being formed by a single layer or multiple layers of an AR coating (anti-reflective coating), transmits both the laser beam of the emission wavelength and the laser beam of the converted wavelength at a transmittance of 98% or more.

Also, the nonlinear optical element 312 and the VBG 313 are disposed on a surface approximately perpendicular to an optical axis of the laser beams emerging from the laser light source.

Operation of the Light Source Device

Next, an operation and an application of the light source device 31 of the projector unit 3 of the rear projector 1 in the embodiment will be described.

The light source device 31 emits laser beams of a prescribed wavelength when a current is caused to flow through the laser medium 311B of the laser light source 311, by means of a control of the control unit 4. For example, in a case of the green beam light source device 31G, on a current being applied to the laser medium 311B, it emits, for example, an infrared laser beam of a wavelength of 1064 nm. Herein, from among the laser beams emitted, it emits laser beams which proceed in a direction approximately perpendicular to the substrate 400 from an end surface of the laser medium 311B on the nonlinear optical element side. Also, laser beams which proceed on the substrate 400 side are also reflected by the second dielectric multilayer 312A, pass through the laser beam medium again, and emerge to the nonlinear optical element 312.

Then, the incident laser beams of the emission wavelength are wavelength converted by the nonlinear optical element 312. For example, in a case of the green beam light source device 31G, an infrared laser beam emitted by the laser light source 311 is wavelength converted to a green laser beam of a wavelength of 532 nm.

Subsequently, the laser beams which have passed through the nonlinear optical element 312 fall on the VBG 313. Then, the Bragg layer 313A of the VBG 313 reflects only the laser beams, from among the incident laser beams, which have the set specified wavelength. For this reason, the emission wavelength of the laser beams, being unaffected by a fluctuation in temperature, is always constant, enabling a band narrowing of simultaneously emitted laser beams.

Meanwhile, the laser beams of the converted wavelength converted by the nonlinear optical element 312 pass through the Bragg layer 313A and the first dielectric multilayer 313B. The laser beams which have passed through the first dielectric multilayer 313B fall on the liquid crystal panels 32, the polarizing plate 33 and the cross dichroic prism 34, synthesized with other laser beams, and are projected from the projection lens 35 as the image light L.

Also, the laser beams of the emission wavelength reflected by the VBG 313 fall again on the nonlinear optical element 312, and are wavelength converted. At this time, as the wavelength of the reflected laser beams of the emission wavelength has been band narrowed, the conversion efficiency in the nonlinear optical element 312 improves.

Then, the thus wavelength converted laser beams, and the laser beams of the converted wavelength reflected by the VBG 313, are reflected by the second dielectric multilayer 312A, fall again on the VBG 313 side, and emerge from the first dielectric multilayer 313B. As such, as the laser beams of the converted wavelength do not proceed on a wasteful optical path, it is possible to suppress a laser beam output reduction. Also, the laser beams of the emission wavelength which have not been wavelength converted by the nonlinear optical element 312 pass through the second dielectric multilayer 312A, and fall on the laser light source.

Then, the laser beams of the emission wavelength falling on the laser light source resonate with the laser beams newly emitted by the laser medium. By this means, the laser output of the laser beams is amplified, and they emerge again toward the nonlinear optical element 312.

As described heretofore, in the light source device 31, the laser beams of the emission wavelength are band narrowed by the VBC, and caused to come and go between the mirror layer 311A of the laser light source and the first dielectric multilayer 313B of the VBG 313. For this reason, the output of the laser beams is further amplified, thus enabling a further improvement in the wavelength conversion efficiency.

Also, when using a surface-emitting laser diode, it being possible to form a plurality of laser elements in close proximity in the substrate 400 of the same semiconductor wafer, at this time, the emergent laser beams emerge parallel to each other. For this reason, it is possible to share the use of the same nonlinear optical element 312 and VBG 313. By integrating a plurality of laser elements in this way, it is possible to increase the output of the transmitted laser beams by the number of the laser elements, without enlarging the light source device 31.

Second Embodiment

Figure 4:
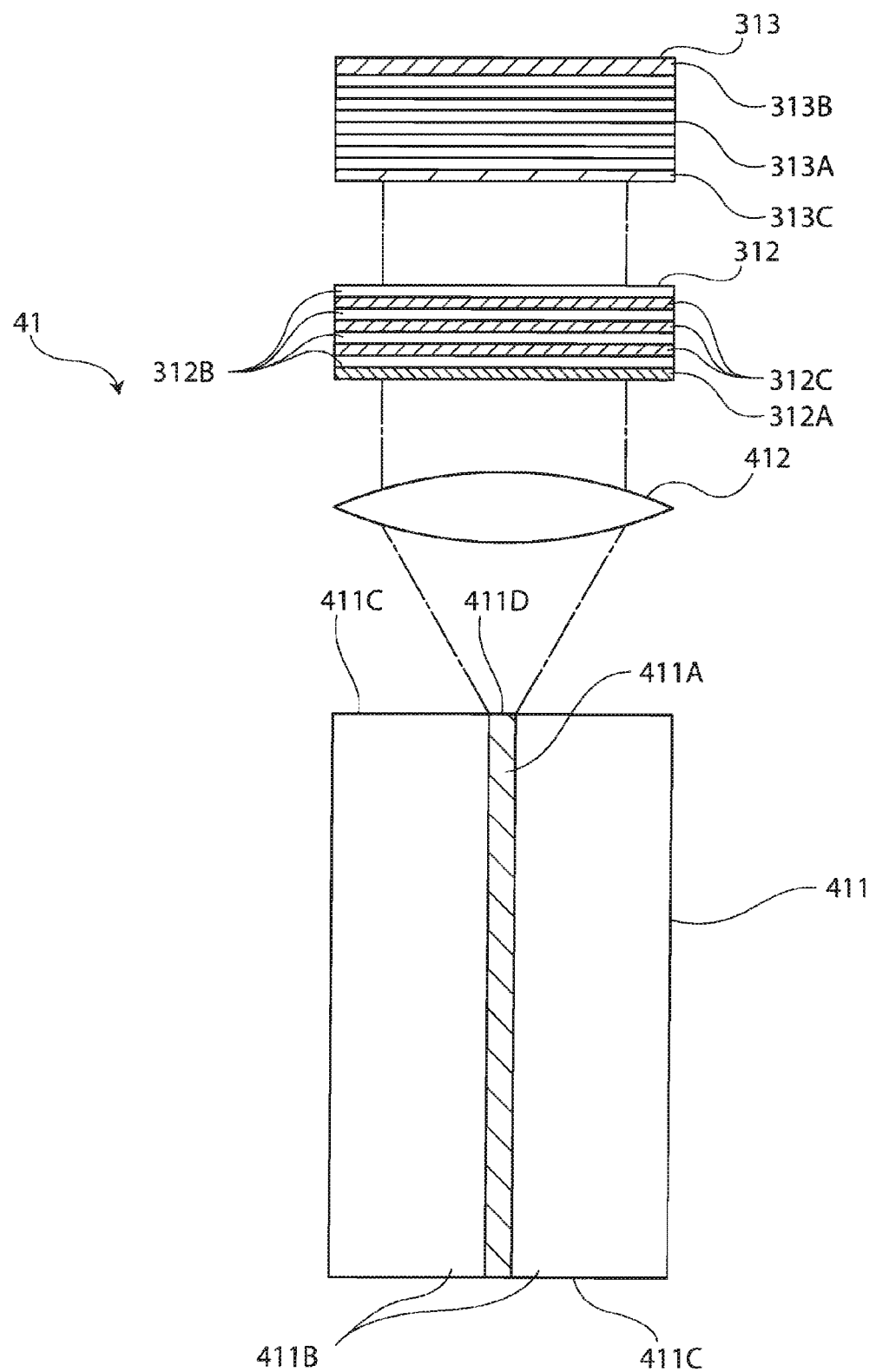
FIG. 4 is a schematic diagram showing an outline of a configuration of a light source device 41 in a second embodiment.

Next, a description will be given of a second embodiment of the invention, based on the drawings. In the following description, identical reference numerals are appended to structures and members identical to those in the first embodiment, an a detailed description is omitted or simplified. FIG. 4 is a schematic diagram showing an outline of a configuration of a light source device 41 in the second embodiment.

In the second embodiment, in place of the light source device 31 contained inside the projector unit 3 in the first embodiment, the light source device 41, using a so-called end surface-emitting laser diode, is used.

Configuration of the Light Source Device

As shown in FIG. 4, the light source device 41 in the second embodiment includes a longitudinal laser light source 411, a parallelizing lens 412, a nonlinear optical element 312 and a VBG 313.

The laser light source 411 is a so-called end surface-emitting laser diode in which a longitudinal laser medium 411A is sandwiched between clad layers 411B. A mirror layer 411C being formed as a reflecting mirror on each longitudinal end surface of the laser medium 411A, by reflecting laser beams between the mirror layers 411C, an output of the laser beams is amplified. A not-shown energizer being provided to the laser medium 411A, on a prescribed volume of current being sent from the energizer by a control of the control unit 4, laser beams of a prescribed emitted wavelength are emitted.

The mirror layers 411C being formed on both end surfaces of the laser medium 411A, as described heretofore, by reflecting the laser beams emitted by the laser medium 411A between the mirror layers 411C, the laser beams are caused to resonate and an output is amplified. Also, an emergence portion 411D is formed on one of the mirror layers 411C, facing the parallelizing lens 412 which acts as a beam parallelizer, and the emitted laser beams emerge from the emergence portion 411D.

The parallelizing lens 412 converts the laser beams emerging from the emergence portion 411D of the laser light source 411 into parallel luminous fluxes The nonlinear optical element 312, having the same configuration as the nonlinear optical element 312 in the first embodiment, is disposed facing the parallelizing lens 412. A second dielectric multilayer 312A is formed on an end surface of the nonlinear optical element 312, on the parallelizinq lens 412 side.

The VBG 313, having the same configuration as the VBG 313 in the first embodiment, is disposed facing the nonlinear optical element 312. Then, a first dielectric multilayer 313B is formed on an emergence side end surface of the VBG 313, while a dielectric thin film 313C is formed on an incidence side end surface.

Operation of the Light Source Device

Next, an operation of the light source device 41 in the second embodiment will be described.

The light source device 41 emits laser beams of a prescribed wavelength when a current is caused to flow through the laser medium 411A of the laser light source 411, by means of a control of the control unit 4. Herein, the emitted laser beams are reflected by the mirror layers 411C on both end surfaces of the laser medium 411A, and come and go inside the laser medium 411A. Then, while coming and going inside the laser medium 411A, they resonate with newly emitted laser beams etc., and their output is amplified. Then, one portion of the amplified laser beams emerges from the emergence portion 411D to the parallelizing lens 412 side.

Then, the laser beams emerging from the emergence portion 411D are converted into parallel luminous fluxes by the parallelizing lens 412 and fall on the nonlinear optical element 312, whereon laser beams of an emission wavelength are wavelength converted by the nonlinear optical element 312.

Subsequently, the laser beams which have passed through the nonlinear optical element 312 fall on the VBG 313. Then, the Bragg layer 313A of the VBG 313 reflects only the laser beams, from among the incident laser beams, of the emission wavelength, band narrowing the laser beams of the emission wavelength. Meanwhile, the laser beams of the converted wavelength converted by the nonlinear optical element 312 pass through a Bragg layer 313A and the first dielectric multilayer 313B, and emerge from the light source device 41.

Also, the laser beams of the emission wavelength reflected by the VBG 313 fall again on the nonlinear optical element 312, and are wavelength converted. Then, the thus wavelength converted laser beams, and one portion of the laser beams of the converted wavelength reflected by the VBG 313, are reflected by the second dielectric multilayer 312A, fall again on the VBG 313 side, and emerge from the first dielectric mnultilayer 313B. Meanwhile, the laser beams of the emission wavelength which have not been wavelength converted by the nonlinear optical element 312 pass through the second dielectric multilayer 312A, and emerge to the parallelizing lens 412 side. Then, in a case of the laser beams emerging from the second dielectric multilayer 312A to the laser light source 411 side, the luminous fluxes are converged toward the emergence portion 411D of the laser light source 411 and fall on the laser medium 411A from the emergence portion 411D.

Then, the laser beams of the emission wavelength falling on the laser light source 411 resonate with laser beams newly emitted by the laser medium 411A, and a laser output is amplified.

In the kind of light source device 41 in the second embodiment, in the same way as the light source device 31 in the first embodiment, the nonlinear optical element 312 is disposed between the laser light source 411 and the VBG 313, and the first dielectric multilayer 313B, which transmits the laser beams of the converted wavelength, is formed on the emergence side end surface of the VBG 313. For this reason, in the same way as in the first embodiment, even in the event that a deviation occurs in the laser beam emission wavelength due to a fluctuation in temperature and the like, is possible to band narrow the laser beams of the emission wavelength in the Bragg layer 313A of the VBG 313, thereby enabling an improvement in a wavelength conversion efficiency of the laser beams of the emission wavelength by the nonlinear optical element 312.

Also, the nonlinear optical element 312 and the VBG 313, using a so-called end surface-emitting laser diode which amplifies the output of the laser beams by reflecting the laser beams at the mirror layers 411C on both end surfaces of the longitudinal laser medium 411A, as the laser light source 411, and causes the amplified laser beams to emerge from the emergence portion 411D, are disposed beyond the parallelizing lens 412 which converts the laser beams into parallel beams. For this reason, laser beams which nave not been wavelength converted by the nonlinear optical element 312 are band narrowed and reflected by the VBG 313, pass through the parallelizing lens 412 and fall again from the emergence portion 411D on the laser medium 411A, enabling an amplification of the laser beam output. Consequently, even in the case of the end surface-emitting laser diode, it is possible to improve an emission efficiency.

Modified Example of the Embodiment

The invention is not limited to the embodiments described heretofore, as modifications, improvements and the like within a scope enabling an achievement of the aim of the invention are included in the invention.

For example, in the first and second embodiments, a configuration is shown in which the red beam light source device 31R, the blue beam light source device 31B and the green beam light source device 31G each include the laser light source 311 the nonlinear optical element 312 and the VBG 313, as shown in FIG. 3, but the invention is not limited to this. That is, in a case of a red laser beam and a blue laser beam, it is possible to cause the red laser beam and the blue laser beam to be emitted directly from the laser light source 311, by selecting an appropriate article as the semiconductor laser element which is the laser medium. Consequently, it is also acceptable to configure in such a way that a heretofore known surface light emitting or an end surface-emitting laser diode is used for the red beam light source device 31R and the blue beam light source device 31B, while the kind of light source device 31 shown in FIG. 3 is used for only the green beam light source device 31G.

Furthermore, a configuration of the second dielectric multilayer 312A is such that it transmits the laser beams of the emission wavelength while reflecting the laser beams of the converted wavelength but it is also acceptable that it transmits both.

Also, in the embodiments, the nonlinear optical material configuring the nonlinear optical element 312 is exemplified by LN (LiNbO$_3$) and LT (LiTaO$_3$), but it is also acceptable to use an inorganic nonlinear optical material other than these, such as KNbO$_3$, BNN (Ba$_2$NaNb$_5$O$_{15}$), KTP (KTiOPO$_4$) KTA (KTiOAsO$_4$), BBO ($\beta$-BaB$_2$O$_4$) or LBO (LiB$_3$O$_7$). Also, it is also acceptable to use a low molecular organic material such as metanitroaniline, 2-methyl-4-nitroaniline, chalcone, dicyanovinylanisole, 3,5-dimethyl-1-(4-nitrophenyl) pyrazole, or N-methoxymethyl-4-nitroaniline, or an organic nonlinear optical element such as a poled polymer.

Furthermore, in the embodiments, an example is shown in which the nonlinear optical element 312 and the VBG 313 are commonly used by a plurality of laser elements, without being limited to this, it is also acceptable to configure in such a way that each laser element is provided with one each.

Then, in the first and second embodiments, the light source units 31 and 41 configuring the projector unit 3 loaded on the rear projector 1 are shown as examples but, without being limited to this, they can also be used in another type of projector, such as a front projector. For example, apart from a transmissive liquid crystal light valve or a reflective liquid crystal light valve, it is also acceptable to employ a digital micromirror device (Texas Instruments brand name).

Although a nest configuration etc. for implementing the invention are disclosed in the above description, the invention is by no means limited to this. That is, although the invention is especially depicted and described mainly with regard to specified embodiments, it is possible for those skilled in the art to add various modifications in form, material, quantity and other detailed configurations with respect to the embodiments, without departing from the technical idea and scope of aim of the invention.

Consequently, as the description limiting the forms, materials and the like disclosed above, being illustrative for the purpose of making it easier to understand the invention, does not limit the invention, descriptions using member names removing one part of the limitation or a whole of the limitation of the forms, materials and the like are included in the invention The invention can be used in a light source device which emits a laser beam, and a projector which includes the light source device.

What is claimed is:

1. A light source device, comprising:
   a laser light source defining a light emergence surface, the laser light source emitting a laser beam of a prescribed wavelength, the laser light source including:
   a light emitting element emitting the laser beam, and
   a mirror disposed at a side of the light emitting element opposite the light emergence surface;
   a nonlinear optical element defining an emergence surface, the nonlinear optical element being disposed facing the light emergence surface of the laser light source, the nonlinear optical element converting an emission wavelength of the laser beam emitted from the laser light source and causing the laser beam to emerge;
   a volume phase grating defining an interior, the volume phase grating facing the emergence surface of the nonlinear optical element, the volume phase grating including:
   a Bragg grating structure disposed at the interior that only reflects a portion of the laser beam having a specified wavelength of the emission wavelength and band narrows the laser beam having the emission wavelength, the portion of the laser beam that is reflected by the Bragg grating passes through the light emitting element, is reflected by the mirror, and resonates with the laser beam newly emitted by the light emitting element, and a first dielectric multilayer, provided at a light emergence surface of the volume phase grating, the first dielectric multilayer transmitting the laser beam of the converted wavelength and reflecting light of other wavelengths including the laser beam of the emission wavelength, the emission wavelength including the specified wavelength and other wavelengths except the specified wavelength.

2. The light source device according to claim 1, the volume phase grating including a dielectric thin film provided at a light incidence surface of the volume phase grating, the dielectric thin film suppressing a reflection of the laser beam of the emission wavelength and the laser beam of the converted wavelength to the nonlinear optical element side.

3. The light source device according to claim 1, the nonlinear optical element being a bulk nonlinear optical element having a polarization reversal structure, the nonlinear optical element including:

a second dielectric multilayer provided at a light incidence surface of the nonlinear optical element, the second dielectric multilayer reflecting the laser beam of the converted wavelength and transmitting the laser beam of the emission wavelength.

4. The light source device according to claim 1, the laser light source being a surface-emitting laser diode, the laser light source including a semiconductor wafer, a reflecting mirror formed on the semiconductor wafer, and a laser medium disposed on the reflecting minor, the laser light source emitting a laser beam from the laser medium, the laser light source having a plurality of laser elements formed on the semiconductor wafer, the laser elements sharing a use of the nonlinear optical element and the volume phase grating.

5. The light source device according to claim 1, the laser light source being an end surface-emitting laser diode including clad layers, a laser medium disposed between the clad layers, and a pair of reflecting mirrors disposed at opposing ends of the laser medium, the light source device further including a beam collimator that collimates the laser beam emitted from the laser light source, the beam collimator being disposed between the light emergence surface of the laser light source and the nonlinear optical element.

6. A projector, comprising:

the light source device according to claim 1 that emits a laser beam;

an optical modulator that modulates the laser beam emitted from the light source device in accordance with image information; and a projection optical system that projects the modulated laser beam.

7. The projector according to claim 6, the volume phase grating including a dielectric thin film provided at a light incidence surface of the volume phase grating, the dielectric thin film suppressing a reflection of the laser beam of the emission wavelength and the laser beam of the converted wavelength to the nonlinear optical element side.

8. The projector according to claim 6, the nonlinear optical element being a bulk nonlinear optical element having a polarization reversal structure, the nonlinear optical element including:

a second dielectric multilayer provided at a light incidence surface of the nonlinear optical element, the second dielectric multilayer reflecting the laser beam of the converted wavelength and transmitting the laser beam of the emission wavelength.

9. The projector according to claim 6, the laser light source being a surface-emitting laser diode, the laser light source including a semiconductor wafer, a reflecting mirror formed on the semiconductor wafer, and a laser medium disposed on the reflecting mirror, the laser light source emitting a laser beam from the laser medium, the laser light source having a plurality of laser elements formed on the semiconductor wafer, the laser elements sharing a use of the nonlinear optical element and the volume phase grating.

10. The projector according to claim 6, the laser light source being an end surface-emitting laser diode including clad layers, a laser medium disposed between the clad layers, and a pair of reflecting mirrors disposed at opposing ends of the laser medium, the light source device further including a beam collimator that collimates the laser beam emitted from the laser light source, the beam collimator being disposed between the light emergence surface of the laser light source and the nonlinear optical element.

11. A light source device, comprising:

a laser light source including:

a light emitting element emitting a laser beam from a light emergence surface of the laser light source, and a mirror disposed at a side of the laser light source opposite the light emergence surface;

a volume phase grating that includes a Bragg grating structure and a dielectric multilayer; and a nonlinear optical element, disposed between the laser light source and the volume phase grating, that converts an emission wavelength of a laser beam emitted from the laser light source;

the Bragg grating structure only reflecting a portion of the laser beam having a specified wavelength of the emission wavelength and band narrowing the laser beam having the emission wavelength, the portion of laser beam that is reflected by the Bragg grating passes through the light emitting element, is reflected by the mirror and resonates with the laser beam newly emitted by the light emitting element;

the dielectric multilayer transmitting the laser beam of the converted wavelength and reflecting light of other wavelengths including the laser beam of the emission wavelength, the emission wavelength including the specified wavelength and other wavelengths except the specified wavelength.

* * * * *